United States Patent
Kawahara et al.

(10) Patent No.: US 7,485,566 B2
(45) Date of Patent: Feb. 3, 2009

(54) METHOD OF MANUFACTURING SEMICONDUCTOR DEVICE

(75) Inventors: Naoyoshi Kawahara, Kanagawa (JP); Kazuyoshi Ueno, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 124 days.

(21) Appl. No.: 11/543,947

(22) Filed: Oct. 6, 2006

(65) Prior Publication Data

US 2007/0082476 A1 Apr. 12, 2007

(30) Foreign Application Priority Data

Oct. 7, 2005 (JP) ............................. 2005-294913

(51) Int. Cl.
*H01L 21/4763* (2006.01)
(52) U.S. Cl. ..................... 438/618; 438/626; 438/637; 438/672
(58) Field of Classification Search ................. 438/618, 438/622, 625, 626, 631, 637, 672, 675
See application file for complete search history.

(56) References Cited

U.S. PATENT DOCUMENTS 7,253,105 B2   8/2007   Dimitrakopoulos et al.

2006/0006530 A1 *   1/2006   Furusawa et al. ........... 438/627
2006/0040490 A1 *   2/2006   Chen et al. ................. 438/629

FOREIGN PATENT DOCUMENTS

| CN | 1832128 A | 9/2006 |
| JP | 2000-200832 | 7/2000 |
| JP | 2002-43315 | 2/2002 |
| JP | 2005-79116 | 3/2005 |

OTHER PUBLICATIONS

Chinese Office Action dated Jan. 18, 2008 with English Translation.

* cited by examiner

*Primary Examiner*—Kevin M Picardat
(74) *Attorney, Agent, or Firm*—McGinn IP Law Group PLLC

(57) ABSTRACT

A method of manufacturing a semiconductor device is provided. The method includes: (A) forming an insulating film with a porous structure on a substrate; (B) forming a trench in the insulating film, the trench being used for forming an interconnection; (C) depositing a metal layer over the insulating film such that the trench is filled in with the metal layer; (D) forming the interconnection by removing an excess metal layer outside the trench; (E) modifying a surface of the insulating film to form a modified layer on the insulating film; and (F) forming a metal film selectively on the interconnection by using plating solution after the (E) modifying process.

19 Claims, 11 Drawing Sheets

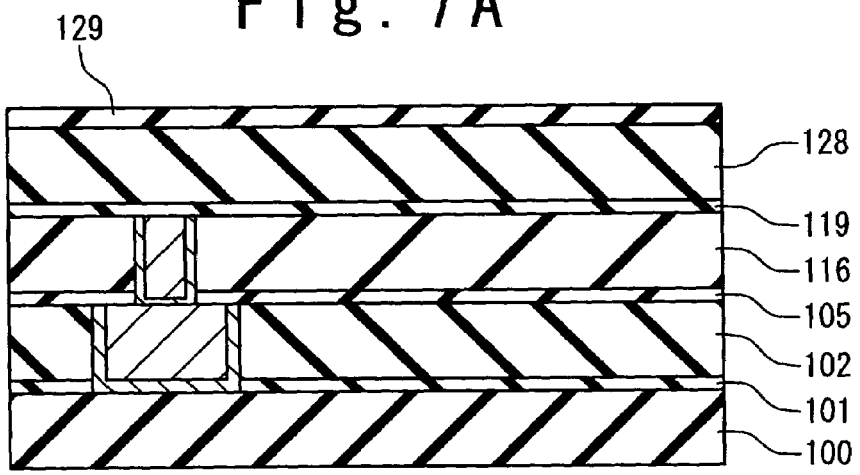
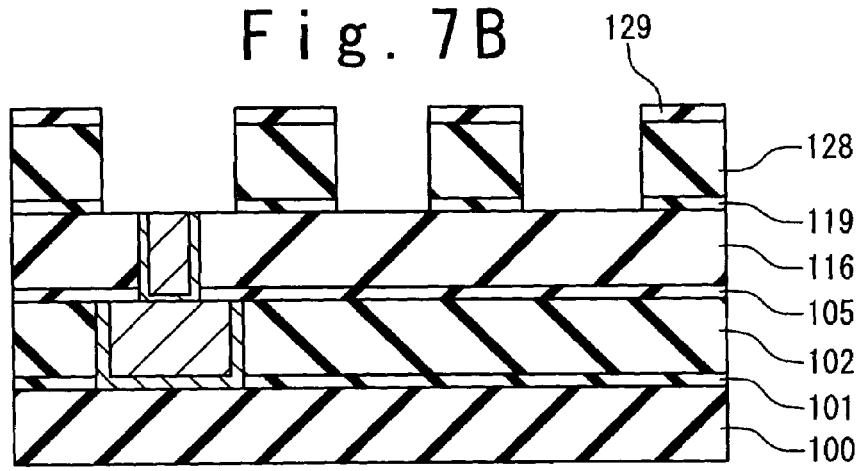
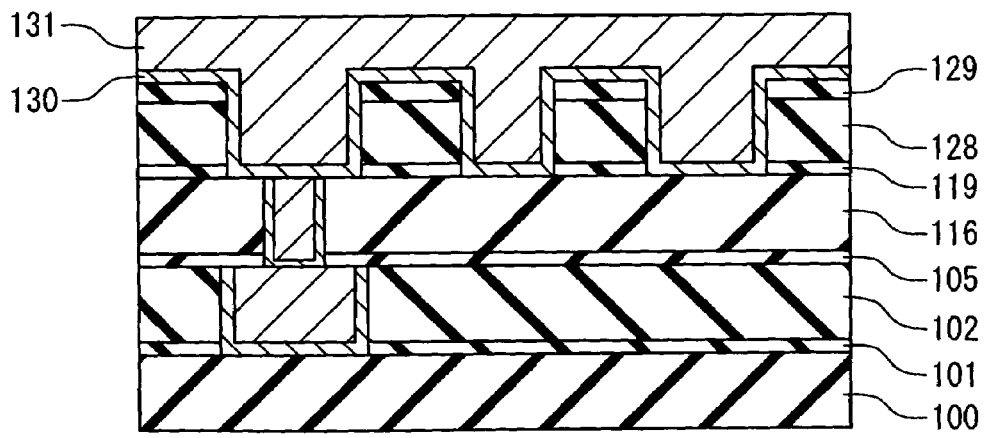

METHOD OF MANUFACTURING SEMICONDUCTOR DEVICE

BACKGROUND OF THE INVENTION

1. Field of the Invention

The present invention relates to a method of manufacturing a semiconductor device.

2. Description of the Related Art

In a semiconductor device of the 65 nm node generation and thereafter, decrease in device size and increase in device speed strengthen the following tendencies: (1) a copper (Cu) interconnection is adopted; and (2) an insulating film having a porous structure is used for an interlayer insulating film.

Japanese Laid-Open Patent Application JP-P2005-79116 discloses a method of manufacturing a semiconductor device whose object is to prevent barrier metal or interconnection material such as Cu or the like from diffusing into an interlayer insulating film. The manufacturing method includes: a process of forming a thin film made of insulating material; a process of punching a hole in the thin film; a process of exposing the thin film to an atmosphere of noble gas plasma; and a process of depositing conductive material to fill in the hole. It is described in the patent document that the diffusion of the barrier metal or the interconnection material into the interlayer insulating film can be thereby prevented reliably and easily.

Japanese Laid-Open Patent Application JP-P2002-43315 discloses a technique of forming a layer containing cobalt on a surface of a copper interconnection through an immersion plating method by the use of metal catalyst.

Japanese Laid-Open Patent Application JP-P2000-200832 discloses a technology for increasing adhesiveness of an inorganic barrier film with respect to a copper interconnection or a copper barrier which exists in an interconnecting structure such as a dual damascene structure in a semiconductor device. For that purpose, a reduction plasma treatment process using gas selected from $H_2$, $N_2$, $NH_3$, noble gas, and mixture of these gases is employed.

SUMMARY OF THE INVENTION

The inventors of the present invention have recognized the following points. When a metal film is selectively formed on a surface of a copper interconnection in a porous interlayer insulating film by using plating solution, the plating solution penetrates into the porous interlayer insulating film through the surface thereof.

FIG. 11 is a cross-sectional view of a semiconductor device observed by using a TEM (Transmission Electron Microscope). In the semiconductor device, a porous insulating film (an SiOC film) is used as the interlayer insulating film. A cap metal film is formed through a selective plating method under a condition that a surface of the porous insulating film is exposed.

More specifically, an etching stopper film 225 is formed on a base insulating film 226, and a porous insulating film 222 is formed on the etching stopper film 225. The base insulating film 226 is formed of an SiOC film, the etching stopper film 225 is formed of an SiCN film, and the porous insulating film 222 is formed of an SiOC film. In the porous insulating film 222, a barrier metal film 224 and a copper film 221 are formed. Also, a cap metal 220 with a thickness of several nanometers is formed on a surface of the copper film 221. The cap metal 220 is made of cobalt tungsten phosphorus (CoWP).

It should be noted in FIG. 11 that a layer 223 (with a thickness of approximately 1 to 2 nm) is formed on the top of the porous insulating film 222, which can be clearly seen from the contrast different from that of the porous insulating film 222. With regard to the semiconductor device having the above-mentioned structure, element of the above-mentioned layer 223 was analyzed by using an ED-XRF (Energy Dispersive X-Ray Fluorescence Spectrometer). As a result, cobalt (Co) was detected from the layer 223. The layer 223 is considered to be formed as a result of metal included in the plating solution penetrating into the surface portion of the porous insulating film 222 when the plating solution acts on the surface of the porous insulating film 222 in the selective plating method. As described above, the inventors of the present invention have found that, in the case where the porous interlayer insulating film is used, the plating solution penetrates not only into the surface portion of the Cu interconnection but also into the surface portion of the porous interlayer insulating film to form the metal layer, at the time when the cap metal is formed by the selective plating method. The penetration of the plating solution into the interlayer insulating film causes deterioration in insulation property between adjacent interconnections and hence reliability such as the TDDB (Time Dependent Dielectric Breakdown) and the like.

In an aspect of the present invention, a method of manufacturing a semiconductor device is provided. The method includes the following processes: (A) forming an insulating film with a porous structure on a substrate; (B) forming a trench on a surface of the insulating film, the trench being used for forming an interconnection; (C) depositing a metal layer over the insulating film such that the trench is filled in with the metal layer; (D) forming the interconnection by removing an excess metal layer outside the trench; (E) modifying a surface of the insulating film to form a modified layer on the insulating film; and (F) forming a metal film selectively on the interconnection by using plating solution after the (E) modifying process.

According to the present invention, the metal film is selectively formed by using the plating solution after the modified layer is formed on the surface of the insulating film having the porous structure. It is therefore possible to prevent the plating solution from penetrating into the insulating film having the porous structure. As a result, the insulation property between adjacent interconnections and the reliability such as the TDDB and the like are improved.

According to the present invention, the modified layer is formed before the (F) process of forming the metal film by using the plating solution. It is possible to design the thickness of the modified layer to be suitable for preventing the plating solution from penetrating into the porous insulating film. It is thus unnecessary to increase the thickness of the modified layer more than necessity, and hence dielectric constant of the manufactured semiconductor device can be kept low.

As the method of forming the modified layer on the surface of the porous insulating film, a plasma treatment can be employed. In a case where the insulating film is made of material including carbon, for example, lack of $CH_3$ group or C appears on the surface of the insulating film by executing the plasma treatment. Consequently, the film composition of the surface portion of the insulating film becomes like that of an $SiO_2$ film. Simultaneously, volume of the surface portion of the insulating film is reduced and thus the hole in the surface portion contracts or disappears. As a result, the modified layer with high film density is formed on the surface of the insulating film.

According to the present invention, as described above, the reliability of the semiconductor device can be improved.

BRIEF DESCRIPTION OF THE DRAWINGS

The above and other objects, advantages and features of the present invention will be more apparent from the following description taken in conjunction with the accompanying drawings, in which:

FIGS. 7A to 7C are cross-sectional views showing processes of manufacturing the semiconductor device according to the second embodiment of the present invention;

DESCRIPTION OF THE PREFERRED EMBODIMENTS

Figure 1:
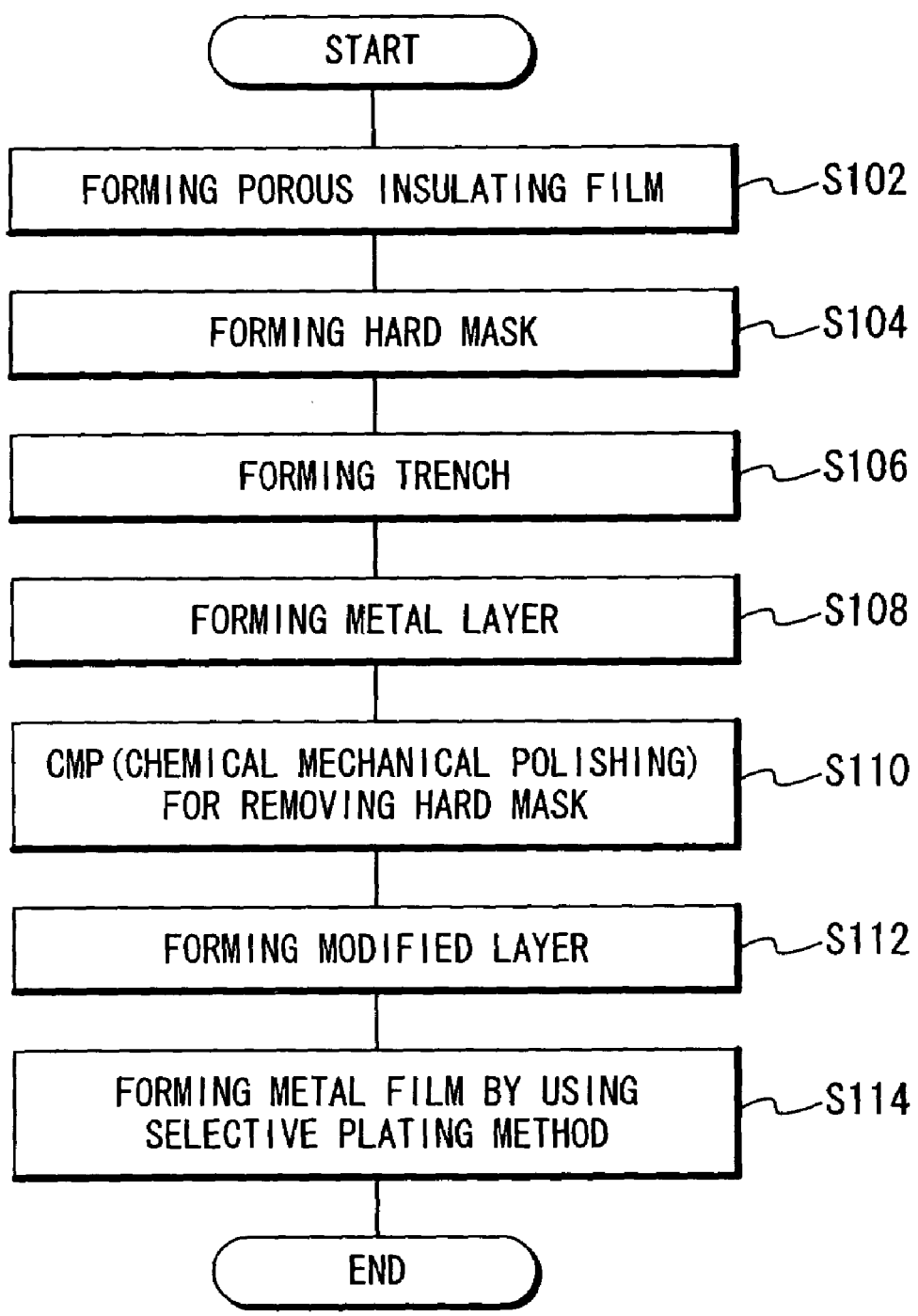
FIG. 1 is a flowchart showing procedures of fabricating a semiconductor device according to a first embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed. It should be noted in all the attached drawings that the same reference numerals are given to the same components, respectively, and redundant explanation will be appropriately omitted.

First Embodiment

FIG. 1 is a flowchart showing procedures of fabricating a semiconductor device according to a first embodiment of the present invention.

In the present embodiment, an insulating film with a porous structure (hereinafter, may be simply referred to as a porous insulating film) is first formed on a semiconductor substrate (Step S102). Subsequently, a hard mask is formed on the porous insulating film (Step S104). Next, a trench (a recess) used for forming an interconnection is formed (Step S106). The trench is formed in the hard mask and the porous insulating film. After that, a metal layer is deposited such that the above-mentioned trench used for forming the interconnection is filled in with the deposited metal layer (Step S108). Subsequently, an excess metal layer of the metal layer outside the trench is removed by CMP (Chemical Mechanical Polishing) (Step S110). As a result, the interconnection is formed in the trench. Moreover, the above-mentioned hard mask is also removed at this time according to the present embodiment. Consequently, a surface of the porous insulating film is exposed. Next, the surface of the porous insulating film is modified to form a modified layer on the porous insulating film (Step S112). Here, the modified layer is formed through plasma exposure (plasma treatment) with respect to the surface of the porous insulating film. After that, a metal film is selectively formed on a surface of the interconnection by the selective plating method using plating solution (Step S114).

Mechanical strength of the porous insulating film is weaker than that of an $SiO_2$ film conventionally used as an interlayer insulating film or a normal (nonporous) low dielectric constant film. Therefore, in a case where the porous insulating film is used as the interlayer insulating film, the porous insulating film is also scraped off in a CMP process. This causes an increase in interconnection resistance and variation of the interconnection resistance.

In order to prevent such a damage of the interlayer insulating film in the CMP process, a surface protection film (hereinafter, referred to as a hard mask) may be formed on the interlayer insulating film. The hard mask has larger mechanical strength than the interlayer insulating film, as exemplified by an $SiO_2$ film. Due to the hard mask, CMP tolerance can be improved. However, such the hard mask exemplified by the $SiO_2$ film has a high dielectric constant. Therefore, when the hard mask is deposited on the surface of the porous insulating film, an effective dielectric constant (parasitic capacitance) of the semiconductor device is increased.

In order to prevent the increase in the effective dielectric constant, it can be considered that the hard mask is also removed when the excess metal film (excess copper film) is removed by the CMP. However, when the hard mask is removed, the surface of the porous insulating film is exposed. Thus, the above-mentioned problem arises that the metal material for the selective plating penetrates into the surface portion of the porous insulating film when a cap metal is formed on the interconnection.

In the processes of manufacturing the semiconductor device according to the present embodiment, not only the porous insulating film is protected by the hard mask, but also the modified layer is formed on the surface of the porous insulating film after the hard mask is removed in the CMP process. The modified layer is formed such that film density of the modified layer becomes higher than that of the porous insulating film. Under a condition that the surface of the porous insulating film is protected in this manner, the cap metal is formed through the selective plating method.

With regard to the porous insulating film in itself, open holes are exposed on its surface, and thus the metal material can penetrate into the surface portion of the porous insulating film. However, due to the formation of the modified layer on the surface of the porous insulating film, the open holes in the surface portion contract or disappear. It is thus possible to prevent the metal material for the selective plating from penetrating into the porous insulating film. In other words, the formation of the modified layer can greatly improve selectivity of the cap metal film formation on the copper interconnection in the selective plating. Moreover, it is possible to design the thickness of the modified layer to be suitable for preventing the plating solution from penetrating into the porous insulating film. It is thus unnecessary to increase the thickness of the modified layer more than necessity, and hence it is possible to suppress increase in the dielectric constant of the insulating film.

As described above, according to the processes of manufacturing the semiconductor device in the present embodiment, the mechanical strength and chemical resistance of the semiconductor device can be improved. Furthermore, the effective dielectric constant of the semiconductor device can be reduced.

FIGS. 2A to 2C, 3A to 3C, 4A to 4C, and 5 are process sectional views showing the processes performed in accordance with FIG. 1. In the present embodiment, an example will be described in which a multi-layer interconnection is formed by the dual damascene process.

Figure 2A:
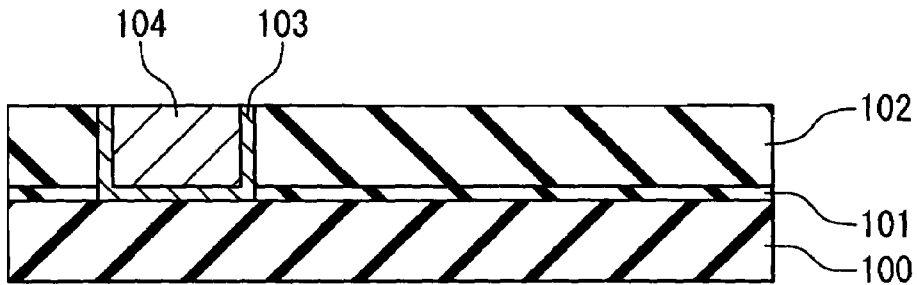
FIGS. 2A to 2C are cross-sectional views showing processes of manufacturing the semiconductor device according to the first embodiment of the present invention.

First, elements such as transistors and the like are formed on a semiconductor substrate (not shown). Then, as shown in FIG. 2A, a first insulating film 100, a first etching stopper film 101, and a second insulating film 102 are formed in this order on the semiconductor substrate. Subsequently, a first barrier metal 103 and a lower layer copper interconnection 104 are formed by the known damascene process.

Figure 2B:
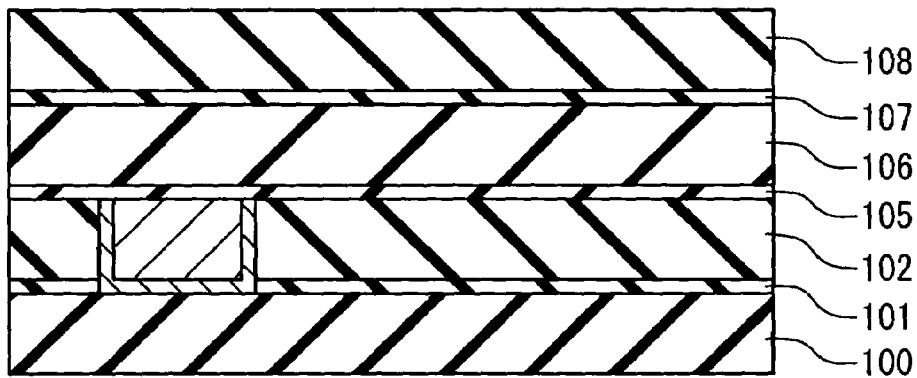

Next, as shown in FIG. 2B, a copper diffusion preventing film 105 is formed on the first insulating film 102. Then, a first interlayer insulating film 106 is formed on the copper diffusion preventing film 105. Here, the first interlayer insulating film 106 can be formed of a porous insulating film. The first interlayer insulating film 106 can be made of the same material as a second interlayer insulating film 108 to be mentioned below.

Subsequently, a second etching stopper film 107 and the second interlayer insulating film 108 are formed on the first interlayer insulating film 106. The copper diffusion preventing film 105 can be formed of an SiCN film, an SiC film, an SiOC film, or a stacked-layer of these films. The second etching stopper film 107 can be formed of an $SiO_2$ film, an SiCN film, an SiC film, an SiOC film, or a stacked-layer of these films.

The second interlayer insulating film 108 can be formed of a porous insulating film. The second interlayer insulating film 108 is, for example, a low dielectric constant film whose dielectric constant is 2.5 or below. The second interlayer insulating film 108 is a porous insulating film, as exemplified by an SiOC (SiOCH) film, an MSQ (Methyl Silses Quioxane) film, an HSQ (MSQ Hydroxide), or an organic polysiloxane film. In the present embodiment, the dielectric constant of the porous insulating film as a whole can be lower than an intrinsic dielectric constant of a film (nonporous film) made of the same material.

Figure 2C:
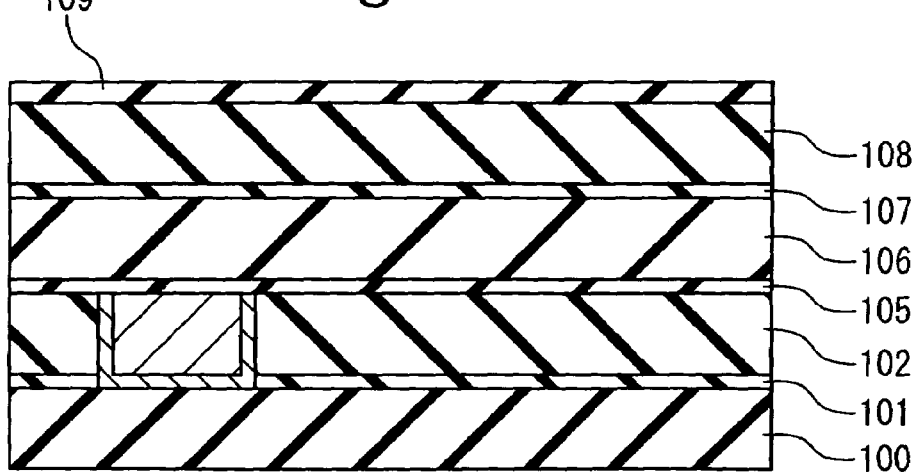

Next, as shown in FIG. 2C, a hard mask 109 is formed on the second interlayer insulating film 108. The hard mask 109 is a protection film used for protecting the surface of the second interlayer insulating film 108, and film density of the hard mask 109 is higher than that of the second interlayer insulating film 108. The hard mask 109 can be formed of, for example, an $SiO_2$ film, an SiOC (SiOCH) film, an SiC film, an SiCN film, or an SiN film. With regard to the hard mask 109, its mechanical strength can be such that the elastic modulus is equal to or more than 10 Gpa, for example. Due to such the hard mask 109, the second interlayer insulating film 108 as the porous insulating film can be sufficiently protected.

Figure 3A:
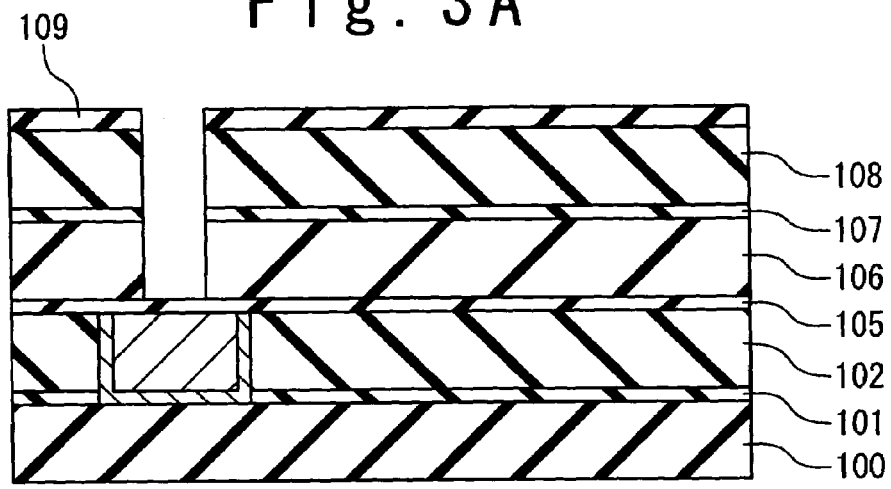
FIGS. 3A to 3C are cross-sectional views showing processes of manufacturing the semiconductor device according to the first embodiment of the present invention.

Next, as shown in FIG. 3A, a via hole is formed to penetrate the hard mask 109, the second interlayer insulating film 108, the second etching stopper film 107, and the first interlayer insulating film 106 by using a known lithography technology and a known etching technology.

Figure 3B:
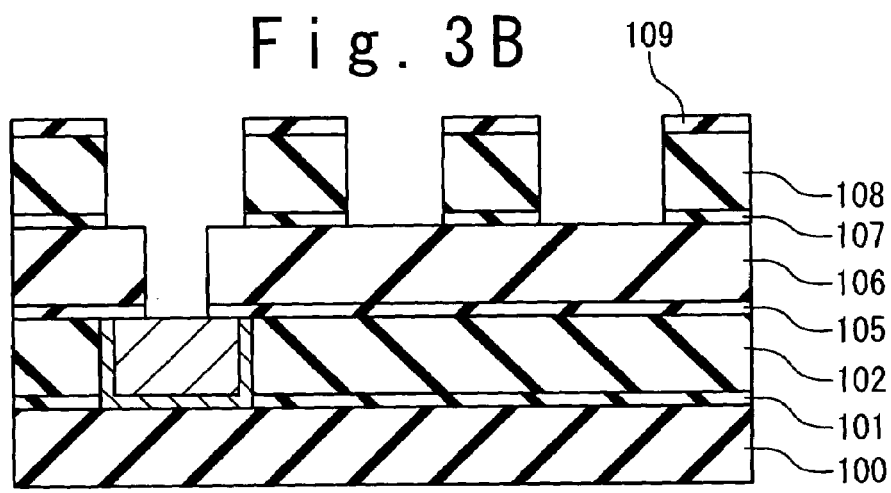

Subsequently, as shown in FIG. 3B, an interconnection trench is formed in the hard mask 109, the second interlayer insulating film 108, and the second etching stopper film 107 by using a known lithography technology and a known etching technology. In FIG. 3B, the interconnection trench is formed to penetrate the hard mask 109, the second interlayer insulating film 108, and the second etching stopper film 107, and is aligned to the via hole. At this time, the copper diffusion preventing film 105 at the bottom of the via hole is also removed by the etching. As a result, a surface of the lower layer copper interconnection 104 is exposed. The interconnection trench is used for forming an interconnection, as described later. In the present example, a via first method in which the via hole is first formed is described. However, the dual damascene process is not limited thereto, and a trench first method, a hard mask process and the like can be also applied.

Figure 3C:
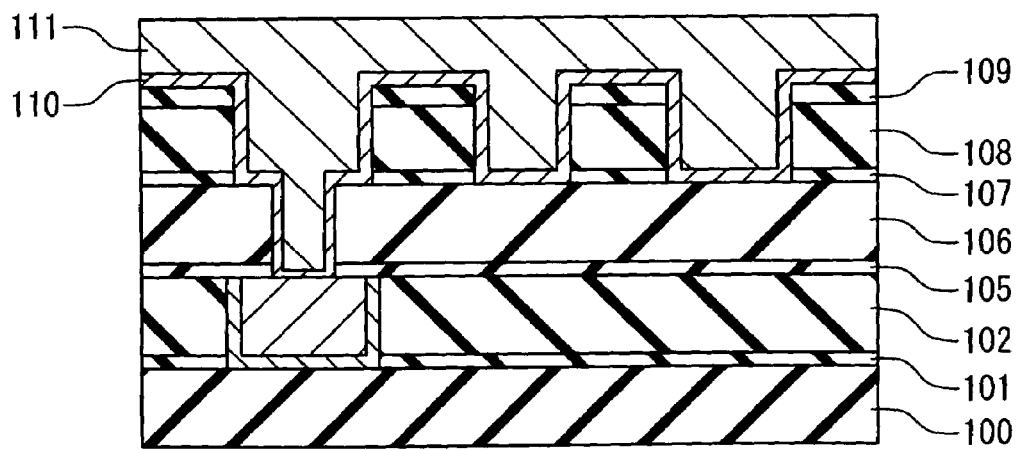

Next, as shown in FIG. 3C, a second barrier metal 110 is formed over the entire surface including the surfaces of the interconnection trench and the via hole. The second barrier metal 110 can be made of, for example, Ta/TaN, Ti, TiN, TiSiN, Ta, TaN, TaSiN, or the like. Subsequently, a copper film 111 is deposited over the entire surface such that the interconnection trench and the via hole are filled in with the copper film 111.

Figure 4A:
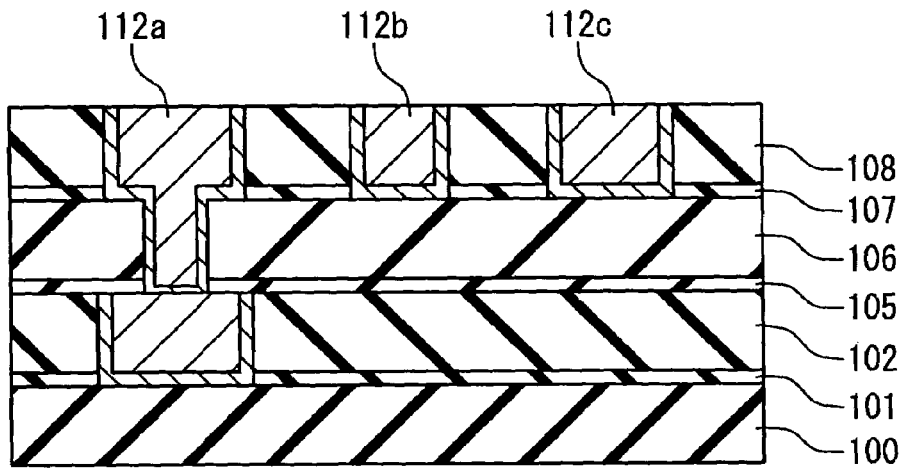
FIGS. 4A to 4C are cross-sectional views showing processes of manufacturing the semiconductor device according to the first embodiment of the present invention.

After that, the excess copper film 111 and the excess second barrier metal 110 outside the interconnection trench are removed by the CMP method. Subsequently, the above-mentioned hard mask 109 is also removed by the CMP method in the present embodiment. Consequently, a first upper layer copper interconnection 112a, a second upper layer copper interconnection 112b, and a third upper layer copper interconnection 112c are formed as shown in FIG. 4A. In FIG. 4A, since the hard mask 109 is removed, the surface of the second interlayer insulating film 108 is exposed.

Figure 4B:
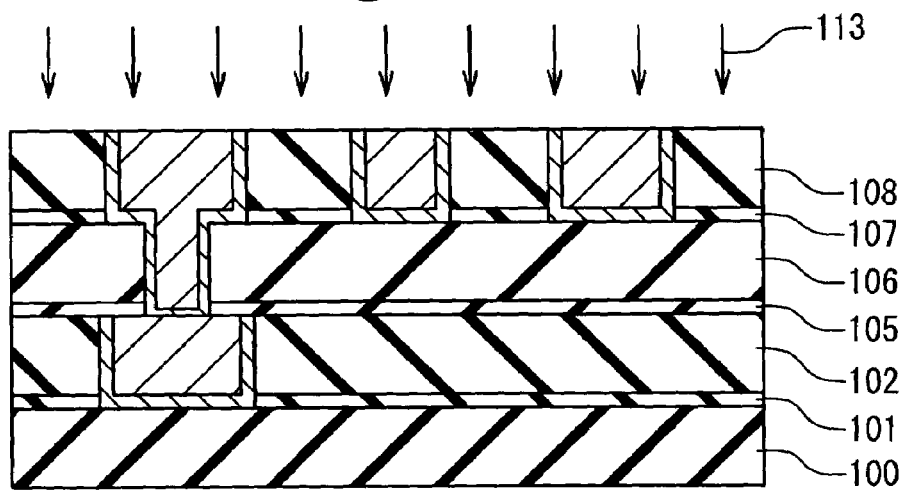
Figure 4C:
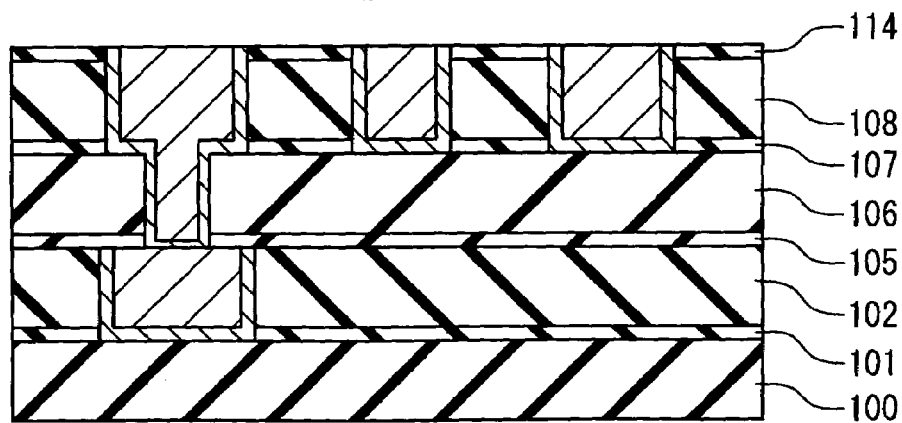

Next, as shown in FIG. 4B, a plasma exposure is performed with respect to the surface of the second interlayer insulating film 108 (as indicated by a reference numeral 113). The plasma exposure (plasma treatment) can be carried out in an atmosphere containing at least one element selected from He, argon, nitrogen, ammonia, hydrogen and so forth. As a result of the plasma exposure, the surface of the second interlayer insulating film 108 is modified, and thereby a modified layer 114 is formed on the second interlayer insulating film 108 as shown in FIG. 4C. In the present embodiment, the plasma exposure is carried out and the modified layer 114 is formed such that film density of the modified layer 114 becomes higher than that of the second interlayer insulating film 108.

In forming the modified layer 114, it is necessary to select an appropriate plasma exposure condition. For example, if the plasma exposure condition is too weak, the second interlayer insulating film 108 is not influenced by the plasma exposure. In this case, it is not possible to form the modified layer 114 enough to prevent the penetration of the metal material during the selective plating. On the other hand, if the plasma exposure condition is too strong, the modified layer 114 is formed to have a large film thickness. When the thickness of the modified layer 114 becomes large, the effective dielectric constant of the semiconductor device is increased. Moreover, film contraction becomes conspicuous and the thickness of the second interlayer insulating film 108 becomes small. Thus, it is preferable that the plasma exposure (plasma treatment) is performed such that the modified layer 114 which is sufficient for preventing the penetration of the metal material in the selective plating method can be formed, and also performed within a range that the increase in the effective dielectric constant of the semiconductor device and the film contraction can be permitted.

As such a plasma treatment condition, for example, ammonia plasma is used, pressure is set in a range from 0.5 mTorr to 50 Torr, an output is set in a range from 0.1 to 500 W, temperature is set in a range from 150 to 450° C., and treatment time is set in a range from 5 to 30 seconds. As one example, the modified layer 114 can be formed by using ammonia plasma and a condition that the pressure is set to 5 Torr, the output is set to 200 W, the temperature is set to 350° C., and the treatment time is set to 30 seconds. A cross section of a semiconductor device including the modified layer 114 thus formed was observed by using an electron microscope. As a result, it was confirmed that the film density of the surface of the second insulating film 108 was high.

According to the present embodiment, the modified layer 114 is formed on the second interlayer insulating film 108 immediately before performing the selective plating method. The modified layer 114 plays a role of preventing the metal material used in the selective plating method from penetrating into the second interlayer insulating film 108. The thickness of the modified layer 114 can be appropriately selected in accordance with that purpose. It is therefore prevented that the thickness of the modified layer 114 increases more than necessity. Thus, the increase in the effective dielectric constant of the semiconductor device and the like can be prevented.

Moreover, it is possible to provide the modified layer 114 with favorable uniformity by forming the modified layer 114 through the plasma exposure in the above-mentioned manner. Furthermore, it is possible to selectively modify the surface portion of the second interlayer insulating film 108 to have high film density. As a result, not only the penetration of material of the plating solution into the second interlayer insulating film 108 can be prevented, but also the dielectric constant of the second interlayer insulating film 108 can be kept low.

Figure 5:
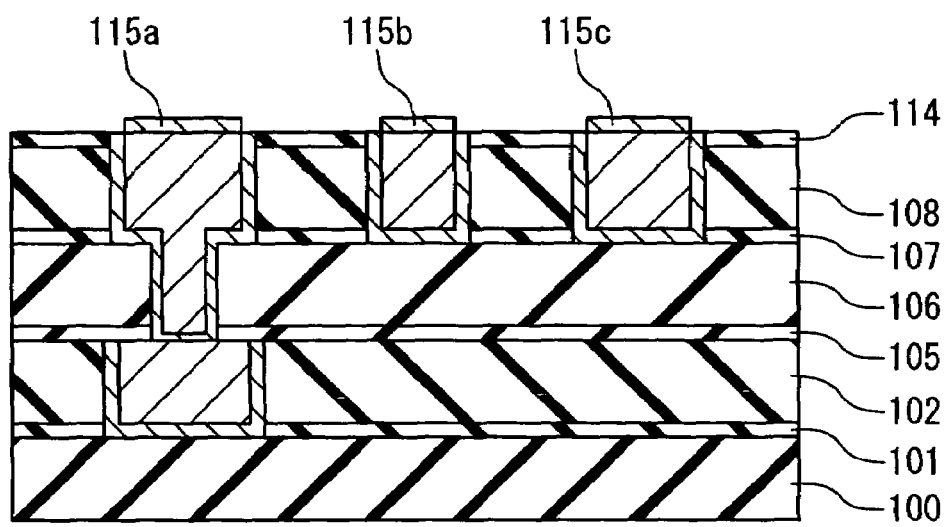
FIG. 5 is a cross-sectional view showing a process of manufacturing the semiconductor device according to the first embodiment of the present invention.

Subsequently, the selective plating is carried out by the use of the plating solution, and as shown in FIG. 5, a first cap metal film 115a, a second cap metal film 115b, and a third cap metal film 115c are selectively formed on respective surfaces of the first upper layer copper interconnection 112a, the second upper layer copper interconnection 112b, and the third upper layer copper interconnection 112c. Here, the plating solution may contain cobalt, nickel, or silver. The cap metal films 115a, 115b, and 115c can be made of a material containing at least one of cobalt, nickel, and silver. For example, the cap metal films 115a, 115b, and 115c are made of CoWP or CoWB.

According to the method of manufacturing a semiconductor device in the present embodiment, the modified layer is formed on the surface of the porous insulating film before the selective plating method using the plating solution is carried out. It is therefore possible to suppress the plating solution from penetrating into the porous insulating film, even in a case where the interlayer insulating film is formed of the porous insulating film. Since the penetration of metal solution into the interlayer insulating film is suppressed, it is possible to prevent deterioration of the insulation property between interconnections and the like. Moreover, the hard mask is provided on the surface of the interlayer insulating film at the time when the interconnection trench is formed and the interconnection material is removed by the CMP method. As a result, the surface of the interlayer insulating film is protected from the damage. Furthermore, since the hard mask is removed in the CMP process, the interconnection structure with low dielectric constant can be achieved.

According to the method of manufacturing a semiconductor device in the present embodiment, it is possible to provide a semiconductor device having a multi-layer interconnection structure with excellent insulation property between adjacent interconnections and with excellent reliability.

Second Embodiment

Also in a second embodiment, a semiconductor device is fabricated through the procedures shown in FIG. 1. The second embodiment differs from the first embodiment mentioned above in that a multi-layer interconnection is formed by a single damascene process.

Figure 6A:
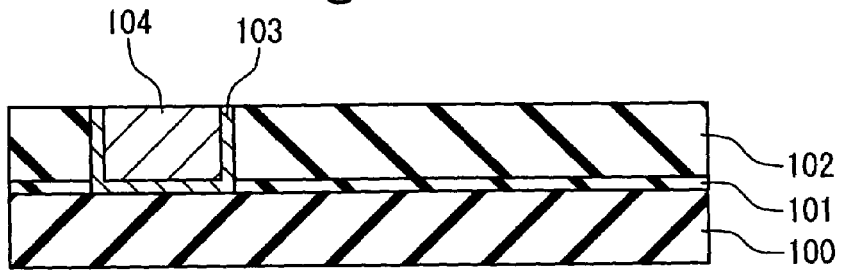
FIGS. 6A to 6D are cross-sectional views showing processes of manufacturing the semiconductor device according to a second embodiment of the present invention.

FIGS. 6A to 6C, 7A to 7C, 8A to 8C, and 9 are process sectional views showing a method of manufacturing a semiconductor device according to the present embodiment. As shown in FIG. 6A, the first insulating film 100 is formed on a semiconductor substrate (not shown) in the same manner as in the first embodiment. The first etching stopper film 101 is formed on the first insulating film 100, and the second insulating film 102 is formed on the first etching stopper film. Then, the first barrier metal 103 and the lower layer copper interconnection 104 are formed in the second insulating film 102 by a known damascene process.

Figure 6B:
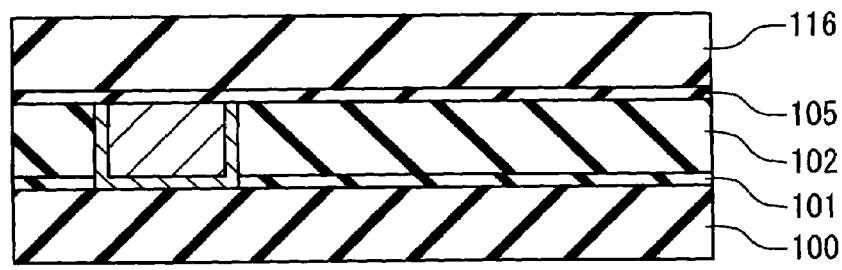

Next, as shown in FIG. 6B, the copper diffusion preventing film 105 is formed on the second insulating film 102, and a third interlayer insulating film 116 is formed on the copper diffusion preventing film 105.

Figure 6C:
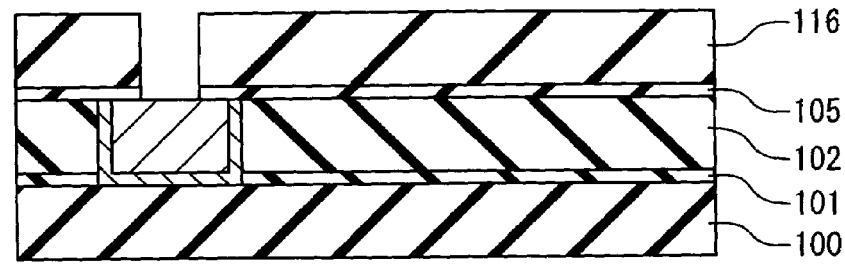
Figure 6D:
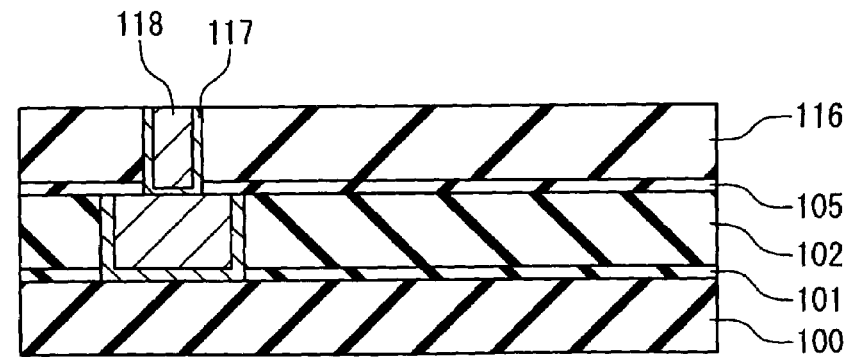

After that, as shown in FIG. 6C, a via hole is formed in the third interlayer insulating film 116 and the copper diffusion preventing film 105 by a known photolithography technology and a known etching technology. Then, a barrier metal 117 is formed on the surface of the via hole. Subsequently, a copper film is formed such that the via hole is filled in with the copper film. After that, an excess copper film and an excess barrier metal 117 outside the via hole are removed by the CMP method. As a result, a copper via 118 is formed as shown in FIG. 6D.

Next, as shown in FIG. 7A, a copper diffusion preventing film 119, a fourth interlayer insulating film 128, and a hard mask 129 are formed in this order on the third interlayer insulating film 116. Then, as shown in FIG. 7B, an interconnection trench is formed in the hard mask 129, the fourth interlayer insulating film 128 and the copper diffusion preventing film 119 by the normal lithography technology and the normal etching technology.

Next, as shown in FIG. 7C, a barrier metal film 130 is formed on the entire surface. Subsequently, a copper film 131 is formed on the entire surface such that the interconnection trench is filled in with the copper film 131.

Figure 8A:
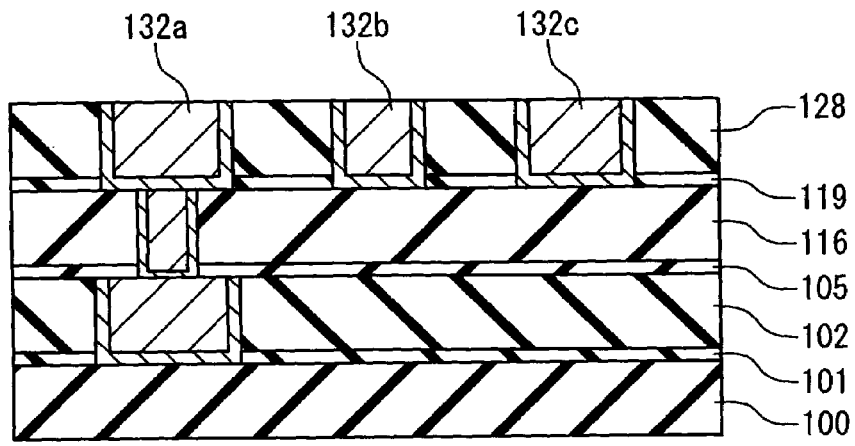
FIGS. 8A to 8C are cross-sectional views showing processes of manufacturing the semiconductor device according to the second embodiment of the present invention.

Subsequently, an exposed excess copper film 131 and an excess barrier metal film 130 outside the interconnection trench are removed by the CMP method. Further, the hard mask 129 is also removed by the CMP method in the present embodiment. As a result, a fourth upper layer copper interconnection 132a, a fifth upper layer copper interconnection 132b, and a sixth upper layer copper interconnection 132c are formed as shown in FIG. 8A. In FIG. 8A, since the hard mask 129 is removed, the surface of the fourth interlayer insulating film 128 is exposed.

Figure 8B:
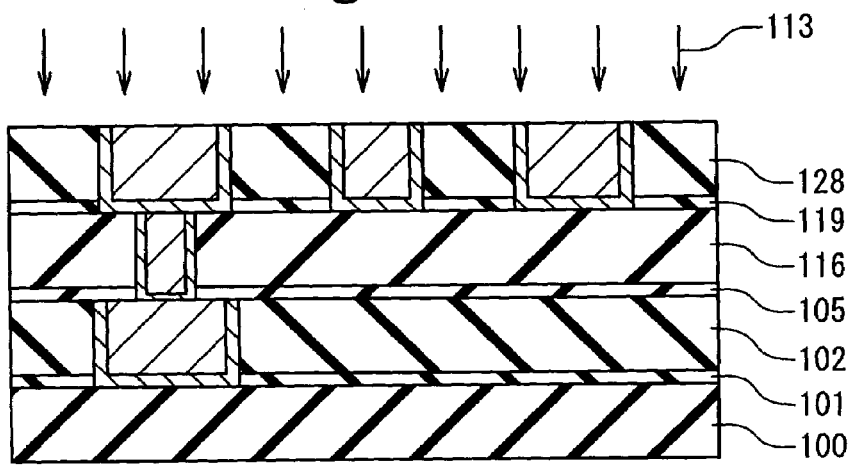
Figure 8C:
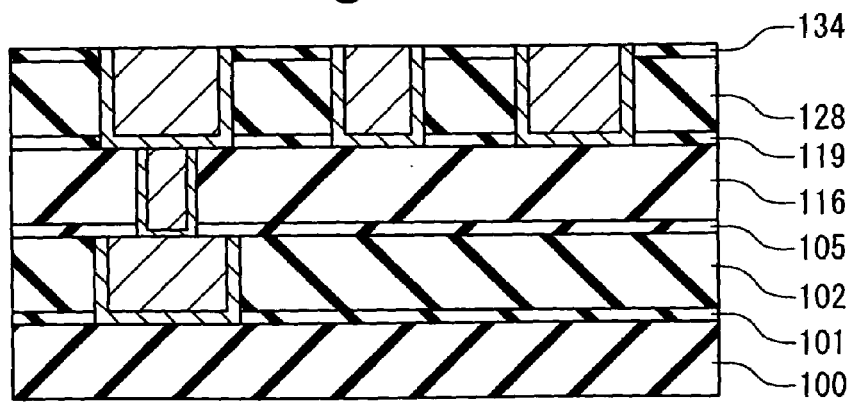

Next, as shown in FIG. 8B, a plasma exposure is performed with respect to the surface of the fourth interlayer insulating film 128 (as indicated by a reference numeral 113). The plasma exposure (plasma treatment) can be carried out in an atmosphere containing at least one element selected from He, argon, nitrogen, ammonia, hydrogen and so forth. As a result of the plasma exposure, the surface of the fourth interlayer insulating film 128 is modified, and thereby a modified layer 134 is formed on the fourth interlayer insulating film 128 as shown in FIG. 8C. In the present embodiment, the plasma exposure is carried out and the modified layer 134 is formed such that film density of the modified layer 134 becomes higher than that of the fourth interlayer insulating film 128.

Also in the present embodiment, if the fourth interlayer insulating film 128 is excessively exposed to the plasma, the modified layer 134 is formed to have a large film thickness. When the thickness of the modified layer 134 becomes large, the effective dielectric constant of the semiconductor device is increased. Moreover, film contraction becomes conspicuous and the thickness of the fourth interlayer insulating film 128 becomes small. Thus, it is preferable that the plasma exposure (plasma treatment) is performed within a range that the increase in the effective dielectric constant of the semiconductor device and the film contraction can be permitted.

Figure 9:
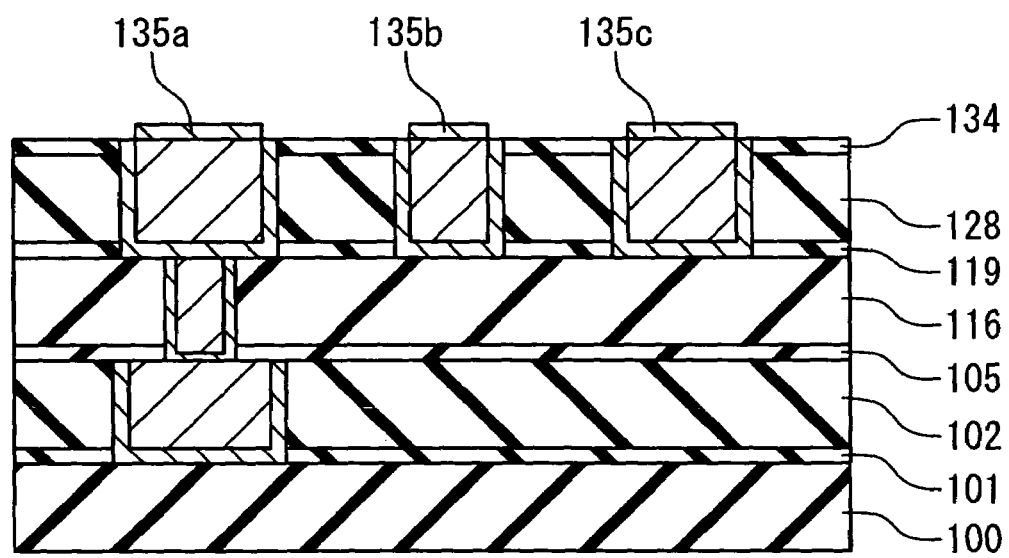
FIG. 9 is a cross-sectional view showing a process of manufacturing the semiconductor device according to the second embodiment of the present invention.

Subsequently, the selective plating is carried out by the use of the plating solution, and as shown in FIG. 9, a fourth cap metal film 135*a*, a fifth cap metal film 135*b*, and a sixth cap metal film 135*c* are selectively formed on respective surfaces of the fourth upper layer copper interconnection 132*a*, the fifth upper layer copper interconnection 132*b*, and the sixth upper layer copper interconnection 132*c*. The same plating solution as that described in the first embodiment can be used. The cap metal films 135*a*, 135*b*, and 135*c* can be made of, for example, CoWP.

Also in the present embodiment, the modified layer 134 is formed on the surface of the fourth interlayer insulating film 128 when the cap metal films are formed by the use of the plating solution. Therefore, the penetration of the plating solution into the fourth interlayer insulating film 128 can be suppressed. As a result, the same effect as in the first embodiment can be obtained.

Third Embodiment

A third embodiment differs from the first embodiment mentioned above in that the hard mask 109 is removed by an etching process.

Figure 10A:
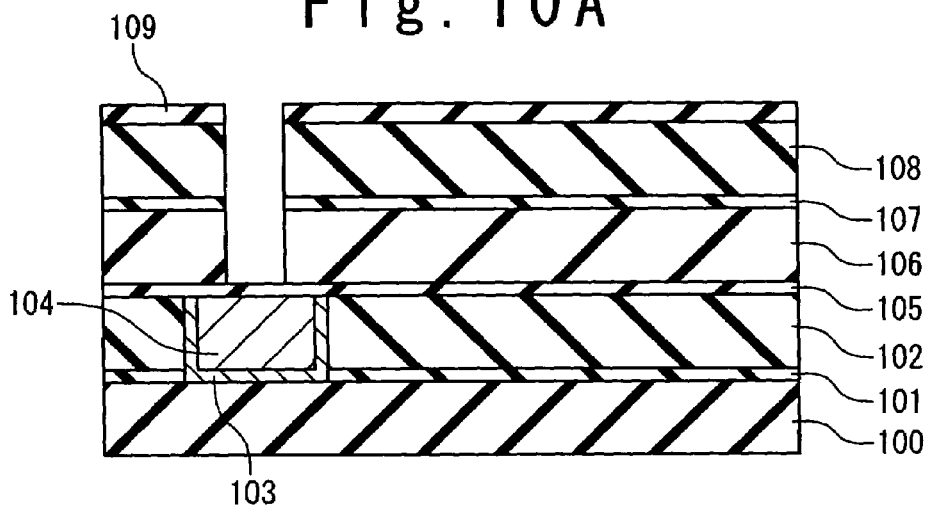
FIGS. 10A to 10C are cross-sectional views showing processes of manufacturing the semiconductor device according to a third embodiment of the present invention.

In the present embodiment, a structure shown in FIG. 10A is formed through the same procedures as those described in the first embodiment with reference to FIGS. 2A to 2C and. 3A. Although not described in detail in the first embodiment, the via hole and the interconnection trench can be formed by using respective of a resist film with an opening for via hole formation and a resist film with an opening for interconnection trench formation. The via hole is formed by forming on the hard mask 109 the resist film for forming the via hole and then selectively etching the hard mask 109, the second interlayer insulating film 108, the second etching stopper film 107, and the first interlayer insulating film 106 by using the above-mentioned resist film as a mask. After the via hole is formed, the resist film is removed by ashing.

Figure 10B:
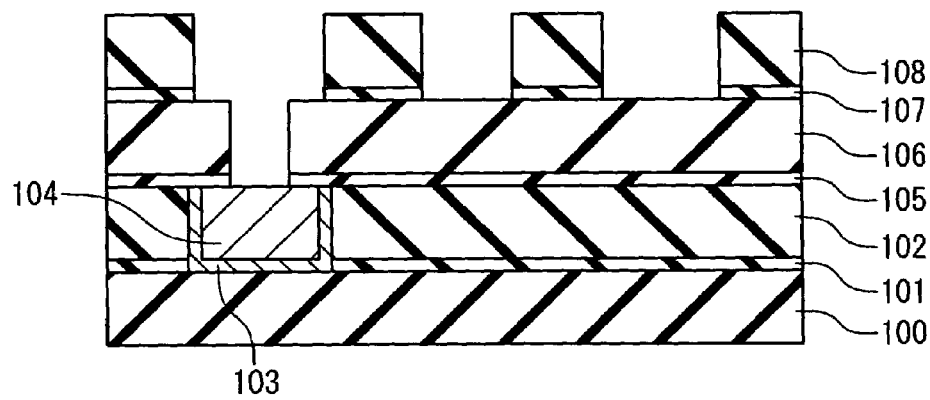
Figure 10C:
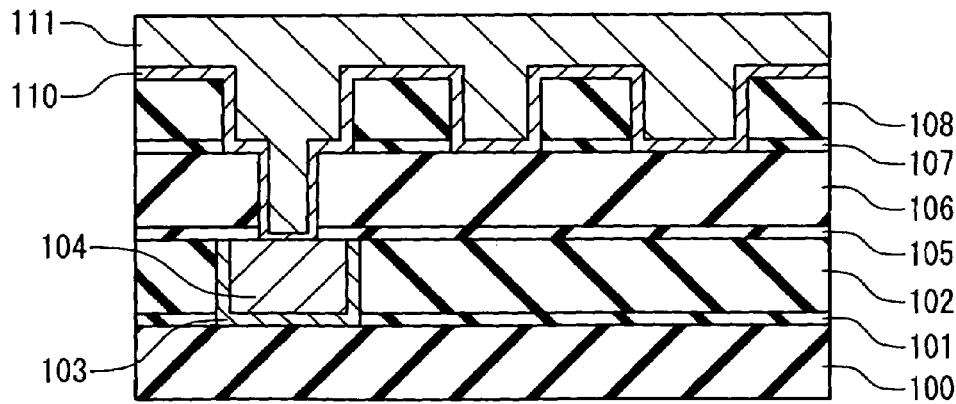
Figure 11:
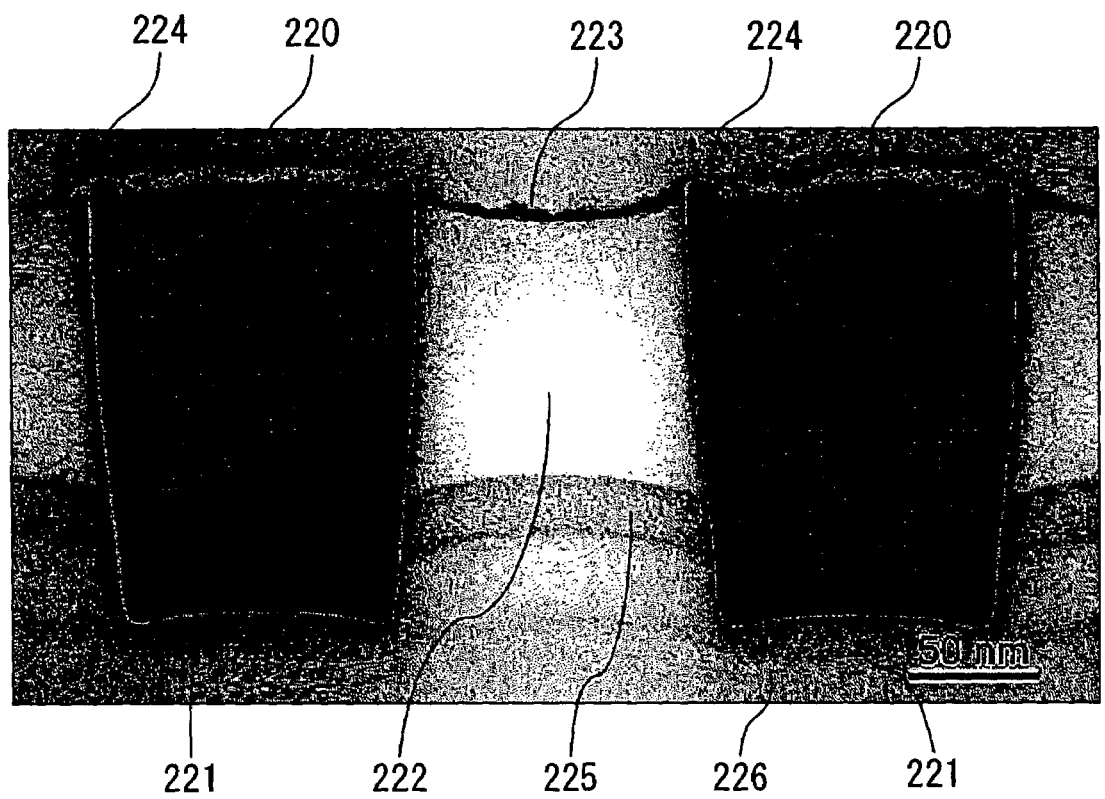
FIG. 11 is a TEM cross-sectional view of a copper interconnection formed in a porous insulating film.

The interconnection trench is formed by forming on the hard mask 109 the resist film for forming the interconnection trench and then selectively etching the hard mask 109, the second interlayer insulating film 108, and the second etching stopper film 107 by using the above-mentioned resist film as a mask. After the interconnection trench is formed, the resist film is removed by ashing. After that, the copper diffusion preventing film 105 exposed at the bottom of the via hole is removed by etching. In the present embodiment, the hard mask 109 on the second interlayer insulating film 108 is also removed by the etching as shown in FIG. 10B. Here, the etching condition is appropriately controlled. Then, as shown in FIG. 10C, the second barrier metal 110 and the copper film 111 are deposited to fill in the interconnection trench.

Subsequent processing can be performed in the same manner as mentioned in the first embodiment with reference to FIGS. 3C, 4A to 4C, and 5.

The hard mask 109 has functions of not only protecting the second interlayer insulating film 108 during the CMP process but also protecting the second insulating film 108 during other processes. For example, the hard mask 109 has a function of providing the second interlayer insulating film 108 with the resist resistance at the time when the resist films for forming the via hole and the interconnection trench are formed on the second interlayer insulating film 108. Moreover, the hard mask 109 also has a function of increasing the ashing resistance at the time when the resist films are removed. As described in the present embodiment, the hard mask 109 is provided between the second interlayer insulating film 108 and the resist film when the resist film is formed over the second interlayer insulating film 108. As a result, the resist resistance and the ashing resistance with respect to the second interlayer insulating film 108 can be improved.

Then, the hard mask 109 is removed. Therefore, the dielectric constant of the semiconductor device is kept low. Furthermore, also in the present embodiment, the modified layer 114 is formed on the surface of the second interlayer insulating film 108 before the cap metal film is formed. As a result, the penetration of the material of the plating solution into the second interlayer insulating film 108 can be prevented, and thus the reliability of the semiconductor device can be improved. It should be noted that the hard mask 129 shown in the second embodiment can also be removed by etching in the single damascene process.

In the embodiments mentioned above, the hard mask is formed on the porous interlayer insulating film, and then the hard mask is removed. The present can be also applied to a case where the hard mask is not formed on the porous interlayer insulating film. Also in such a case, material of plating solution may possibly penetrate into the porous interlayer insulating film, if a selective plating method using the plating solution is performed under a condition that the surface of the porous interlayer film is left exposed. According to the present invention, however, such penetration of the material can be prevented.

In the present embodiments mentioned above, an example is described in which the cap metal film is formed on the surface of the upper layer copper interconnection. The cap metal film can be also formed on the surfaces of the lower layer copper interconnection. In the first embodiment, for example, the cap metal film can be formed on the surface of the lower layer copper interconnection 104, instead of forming the copper diffusion preventing film 105 on the first insulating film 102. In this case, the modified layer can be formed on the surface of the lower layer interlayer insulating film in which the lower layer copper interconnection 104 is formed.

It is apparent that the present invention is not limited to the above embodiment and may be modified and changed without departing from the scope and spirit of the invention.

What is claimed is:

1. A method of manufacturing a semiconductor device comprising:

forming an insulating film with a porous structure on a substrate;

forming a trench in said insulating film, said trench being used for forming an interconnection;

depositing a metal layer over said insulating film such that said trench is filled in with said metal layer;

forming said interconnection by removing an excess metal layer of said metal layer outside said trench;

modifying a surface of said insulating film to form a modified layer on said insulating film; and forming a metal film selectively on said interconnection by using plating solution after said modifying said surface.

2. The method according to claim 1, wherein said modified layer is formed through plasma exposure with respect to said surface of said insulating film.

3. The method according to claim 2, wherein said plasma exposure is carried out in an atmosphere containing at least one element selected from the group consisting of helium, argon, nitrogen, ammonia, and hydrogen.

4. The method according to claim 1, wherein said modified layer is formed such that film density of said modified layer becomes higher than that of said insulating film.

5. The method according to claim 1, further comprising:

forming a protection film on said insulating film before said forming said interconnection, said protection film having film density higher than that of said insulating film; and removing said protection film before said modifying.

6. The method according to claim 5, wherein, said removing is carried out after said excess metal layer is removed in said forming said interconnection.

7. The method according to claim 5, wherein said excess metal layer is removed by chemical mechanical polishing in said forming said interconnection, and wherein subsequently said removing is carried out by chemical mechanical polishing.

8. The method according to claim 5, wherein said modified layer is formed such that a dielectric constant of said modified layer is lower than that of said protection film.

9. The method according to claim 1, wherein said excess metal layer outside said trench is removed by chemical mechanical polishing in said forming said interconnection.

10. The method according to claim 1, wherein said plating solution contains at least one element selected from the group consisting of cobalt, nickel, and silver in said forming said interconnection.

11. The method according to claim 1, wherein said insulating film comprises carbon.

12. The method according to claim 1, wherein said forming said metal film selectively comprises forming said metal film other than on said modified layer.

13. The method according to claim 5, further comprising:

forming a via hole to penetrate said protection film before said forming said trench.

14. The method according to claim 1, wherein said metal layer comprises Cu and at least one of Ta, TaN, Ti, TiN, TiSiN, TaSiN, and a Ta/TaN compound.

15. The method according to claim 1, further comprising:

forming a via hole in said insulating film after said forming said insulating film;

depositing a via metal layer over said via hole after said forming said via hole such that said via hole is filled in with said via metal layer; and removing an excess of said via metal layer before said forming said trench, wherein said via metal layer comprises Cu and at least one of Ta, TaN, Ti, TiN, TiSiN, TaSiN, and a Ta/TaN compound.

16. The method according to claim 5, wherein said removing said protection film comprises said etching said protection film.

17. The method according to claim 1, wherein said metal layer comprises:

a copper film; and a barrier metal formed on said copper film, said barrier metal comprising at least one of Ta, TaN, Ti, TiN, TiSiN, TaSiN, and a Ta/TaN compound.

18. A semiconductor device, comprising:

an insulating layer formed on a substrate, said insulating layer having a porous structure;

a trench formed in said insulating film;

a metal layer deposited over said insulating film such that said trench is filled with said metal layer;

an interconnection formed by removing an excess amount of said metal layer deposited outside said trench;

a modified layer formed on said insulating film; and a metal film selectively formed on said interconnection.

19. The semiconductor device according to claim 18, wherein said metal film is formed other than on said modified layer.

* * * * *